United States Patent
Vialpando et al.

(10) Patent No.: US 7,403,095 B2
(45) Date of Patent: Jul. 22, 2008

(54) THIN FILM RESISTOR STRUCTURE AND METHOD OF FABRICATING A THIN FILM RESISTOR STRUCTURE

(75) Inventors: Brian Vialpando, Dallas, TX (US); Eric William Beach, Tucson, AZ (US); Philipp Steinmann, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/242,575

(22) Filed: Oct. 4, 2005

(65) Prior Publication Data
US 2006/0027526 A1 Feb. 9, 2006

Related U.S. Application Data

(62) Division of application No. 10/727,392, filed on Dec. 4, 2003, now Pat. No. 7,112,286.

(51) Int. Cl.
*H01C 1/012* (2006.01)
(52) U.S. Cl. .......................... 338/309; 338/308; 216/16; 216/17; 216/18; 204/192.32
(58) Field of Classification Search ............ 216/16–18; 204/192.32; 338/308, 309
See application file for complete search history.

(56) References Cited

U.S. PATENT DOCUMENTS

| 5,736,419 | A | * | 4/1998 | Naem | 438/300 |
| 5,870,121 | A | * | 2/1999 | Chan | 347/59 |
| 6,027,987 | A | * | 2/2000 | Yamazaki et al. | 438/486 |
| 6,284,652 | B1 | | 9/2001 | Charneski et al. | 438/653 |
| 6,313,027 | B1 | | 11/2001 | Xu et al. | 438/653 |
| 6,429,128 | B1 | | 8/2002 | Besser et al. | 438/684 |
| 6,475,400 | B2 | | 11/2002 | Lammert | 216/16 |
| 6,607,962 | B2 | | 8/2003 | Zekeriya et al. | 438/384 |
| 6,930,299 | B2 | * | 8/2005 | Ohkawa | 250/208.1 |
| 2001/0000158 | A1 | * | 4/2001 | Ku et al. | 438/629 |
| 2001/0016396 | A1 | * | 8/2001 | Lee | 438/412 |
| 2003/0038369 | A1 | * | 2/2003 | Layadi et al. | 257/750 |
| 2004/0227614 | A1 | * | 11/2004 | Kwok et al. | 338/308 |

* cited by examiner

*Primary Examiner*—Shamim Ahmed
(74) *Attorney, Agent, or Firm*—Wade J. Brady, III; Frederick J. Telecky, Jr.

(57) ABSTRACT

A thin film resistor structure and a method of fabricating a thin film resistor structure is provided. The thin film resistor structure includes an electrical interface layer or head layer that is a combination of a Titanium (Ti) layer and a Titanium Nitride (TiN) layer. The combination of the Ti layer and the TiN layer mitigates resistance associated with the electrical interface layers.

8 Claims, 8 Drawing Sheets

THIN FILM RESISTOR STRUCTURE AND METHOD OF FABRICATING A THIN FILM RESISTOR STRUCTURE

This application is a division of Ser. No. 10/727,392, U.S. Pat. No. 7,112,286, filed Dec. 4, 2003.

TECHNICAL FIELD

The present invention is directed to a thin film resistor structure and a method of fabricating a thin film resistor structure.

BACKGROUND OF THE INVENTION

Thin film resistors are very attractive components for high precision analog and mixed signal applications. In addition to a low thermal coefficient of resistance and low voltage coefficient of resistance, thin film resistors provide good resistor matching and good stability under thermal stress. To achieve good stability under thermal stress, it is critical to not only control the resistance of the body of the thin film resistor, but also the resistance of the electrical interface layer to the thin film resistor. Ideally, the resistance of the electrical interface layer should not contribute to the resistance of the thin film resistor.

Typically, thin film resistor fabrication processes implement titanium tungsten (TiW) as an electrical interface layer to the thin film resistor layer. A disadvantage associated with using titanium tungsten (TiW) as the electrical interface layer to the thin film resistor layer is that titanium tungsten (TiW) contributes to the overall resistance associated with the thin film resistor layer. In other words, the resistivity of the thin film resistor is not well controlled by the titanium tungsten (TiW) electrical interface layer, and contributes to increased thermal stress and an increased thermal coefficient of resistance (TCR) of the thin film resistor. Another disadvantage associate with using titanium tungsten (TiW) as an electrical interface layer is high particulate levels, as well as maintenance issues associated with the high particulate levels.

SUMMARY OF THE INVENTION

The present invention relates to a thin film resistor (TFR) structure and a method of fabricating a TFR structure. The TFR structure includes an electrical interface layer or head layer that is a combination of a Titanium (Ti) layer and a Titanium Nitride (TiN) layer. The combination of the Ti layer and the TiN layer provides a relatively low resistance associated with the electrical interface layer the TFR structure.

In one aspect of the invention, a TFR structure is provided that includes a TFR. A first electrical interface portion is coupled to a first end of the TFR, and a second electrical interface portion is coupled to a second end of the TFR. The first electrical interface portion and the second electrical interface portion are formed of a layer of titanium (Ti) and a layer of titanium nitride (TiN).

Another aspect of the present invention relates to a method of fabricating a TFR structure. The method of forming the TFR structure includes forming a TFR material layer and forming an oxide layer over the TFR material layer. The TFR needs to be produced using a photoresist and etch process. A first TFR via is formed in the oxide layer over a first end of the TFR, and a second TFR via is formed in the oxide layer over a second end of the TFR. The TFR vias are etched in the oxide layer using either wet or dry chemistries or a combination of both. The photoresist layer is stripped off after the via etch step. A wet fluorinated etch step using a dilute hydrofluoric acid solution is employed to clean the surface of the TFR material layer and remove any remaining oxide. A sputter etch process is then applied to remove native oxides which may have built up on the TFR material layer. A layer of titanium (Ti) is formed over the first and second TFR vias, and a layer titanium nitride (TiN) is formed on the (Ti) layer. The titanium (Ti) layer and titanium nitride (TiN) layer can be etched to form an opening that defines a first electrical interface portion coupled to the first end of the TFR layer and a second electrical interface portion coupled to the second end of the TFR layer.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

The present invention is directed to a thin film resistor structure and a method of fabricating a thin film resistor structure. The thin film resistor structure includes an electrical interface layer or head layer that is a combination of a Titanium (Ti) layer and a Titanium Nitride (TiN) layer. The combination of the Ti layer and the TiN layer mitigates resistance associated with the electrical interface. Additionally, the employment of the Ti layer provides a more reproducible resistivity value associated with the electrical interface layer. Furthermore, the Ti layer acts a glue layer to facilitate adhesion of the TiN to the thin film resistor material.

Figure 1:
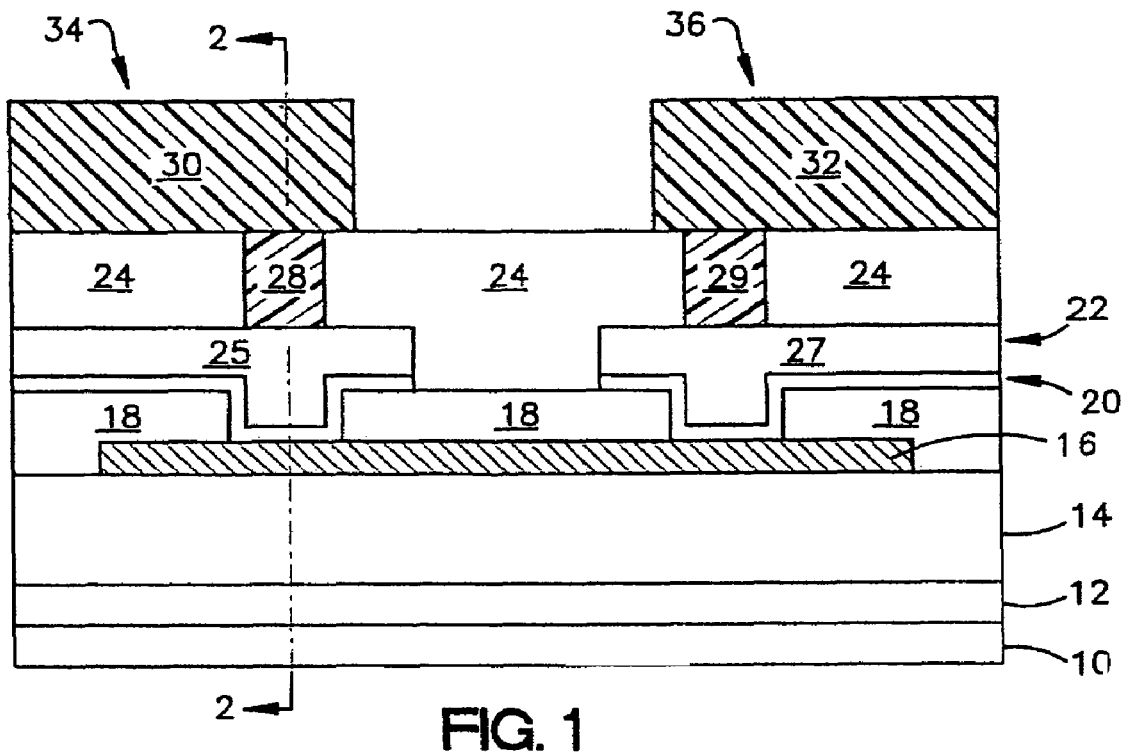
FIG. 1 illustrates a schematic cross-sectional view of a resultant TFR structure in accordance with the method of the present invention.
Figure 2:
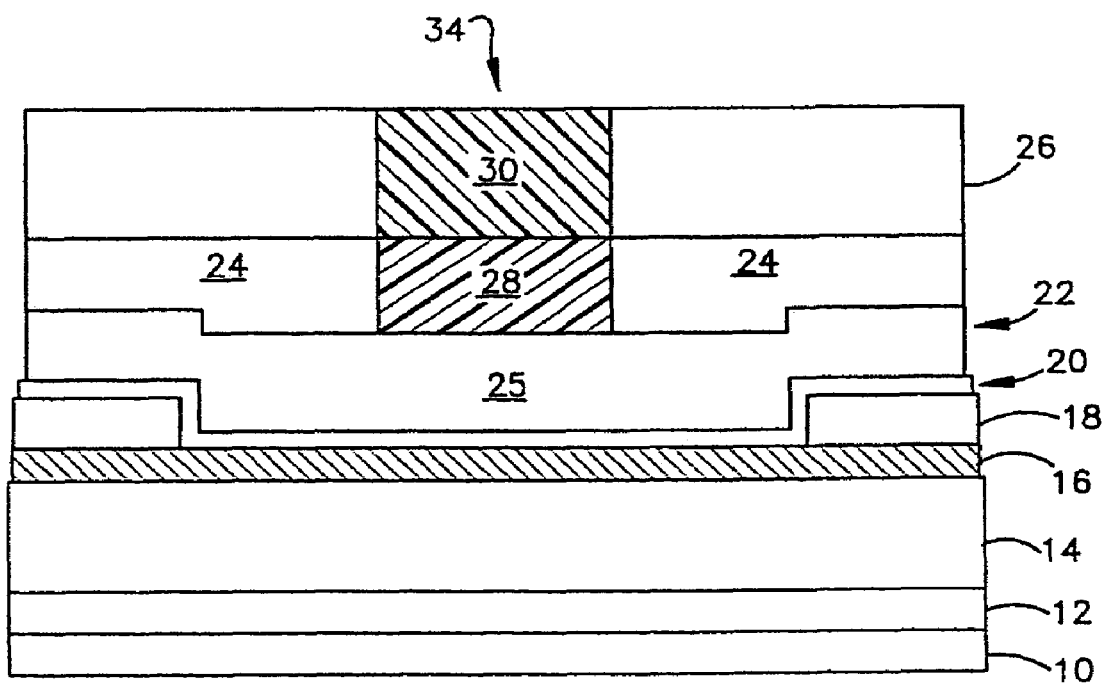
FIG. 2 illustrates a sectional view along line A-A of the resultant structure illustrated in FIG. 1.

FIG. 1 illustrates a cross-sectional view of a thin film resistor (TFR) structure in accordance with an aspect of the present invention. FIG. 2 illustrates a sectional view along line 2-2 of the resultant structure illustrated in FIG. 1. A metal interconnect layer 12 resides over a dielectric layer 10. The dielectric layer 10 can be formed over a semiconductor structure such as a semiconductor substrate and/or any number of intervening layers above a semiconductor substrate. The layers beneath the dielectric 10 can comprise any number of metal interconnect levels. An inter-level dielectric layer 14 resides over the metal interconnect layer 12. The inter-level dielectric layer 14 can comprise silicon oxide formed using any suitable method including chemical vapor deposition. A thin film resistor (TFR) 16 resides above the inter-level dielectric layer 14.

The TFR structure has first contact 34 coupled to a first electrical interface portion 25, and a second contact 36 coupled to a second electrical interface portion 27. The first contact 34 has a first contact portion 28 and a first conductive portion 30. The second contact 36 has a second contact portion 29 and a second conductive portion 32. The first and second contact portions 28 and 29 can be formed from at least one of tungsten, aluminum, aluminum alloy, copper, copper alloy, or a tungsten alloy. The first and second conductive portions 30 and 32 can be formed from at least one of aluminum, aluminum alloy, copper, copper alloy, tungsten, a tungsten alloy or a composite of predominantly aluminum with small amounts of titanium and titanium nitride.

The first electrical interface portion 25 and the second electrical interface portion 27 couple the first contact 34 and the second contact 36 to respective first and second ends of the TFR material layer 16. A dielectric layer 24 provides electrical isolation between the first electrical interface portion 25 and the second electrical interface portion 27. Additionally, the dielectric layer 24 overlays the first and second interface layers between the first and second contact portions 28 and 29. A dielectric layer 26 overlays the dielectric layer 24 between the first and second conductive portions 30 and 32.

The first and second electrical interface portions 25 and 27 are formed of a titanium (Ti) interface layer 20 over the TFR layer 16 and a titanium nitride (TiN) interface layer 22 deposited over the (Ti) layer. The first and second electrical interface portions 25 and 27 are also known as the TF (thin film) Heads, the diffusion layer, the barrier layer, or the capping layer. The function of the first and second electrical interface portions 25 and 27 are to provide electrical connection to the thin film resistor layer 16, and to protect the thin film resistor layer from subsequent pattern and etching processes. Using the combination of the Ti layer 20 and the TiN layer 22 on top of the Ti layer 20 as components of the first and second electrical interface portions 25 and 27 mitigates resistance associated with the TF head.

The Ti layer 20 functions to provide a more reproducible value of the resistance associated with interface layers 20 and 22 relative to a TiN only interface layer. Another function of the Ti layer 20 is to lower the resistance of the interface layers 20 and 22. The Ti:TiN interface layers are compatible with sub-micron metallization process, and provide good thermal stability of the interface to the TFR which results in a lower thermal coefficient of resistance (TCR), reproducible resistance values, and low particulate levels.

Figure 3:
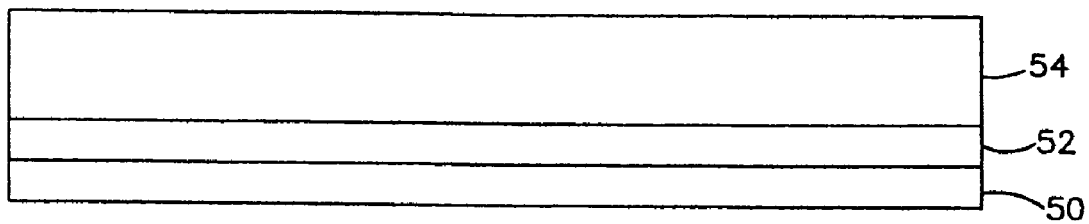
FIG. 3 illustrates a schematic cross-sectional view of a dielectric layer formed over a metal interconnect layer in accordance with an aspect of the present invention.

FIGS. 3-18 illustrate a methodology for fabrication of a TFR structure shown in FIGS. 1-2 in accordance with an aspect of the present invention. FIG. 3 illustrates an inter-level dielectric layer 54 formed over a metal interconnect 52 (e.g., aluminum, aluminum alloy, copper, copper alloy, tungsten, tungsten alloy) residing over a substrate 50. The substrate 50 can comprise semiconductor devices or circuits. Alternatively, the inter-level dielectric layer 54 can be formed directly over a semiconductor substrate and any number of intervening layers.

The inter-level dielectric layer 54 can comprise silicon oxide formed using any suitable method including chemical vapor deposition Low Pressure Chemical Vapor Deposition (LPCVD), Plasma Enhanced Chemical Vapor Deposition (PECVD), sputtering or high density plasma chemical vapor deposition (HDPCVD). In one aspect of the present invention, the inter-level dielectric layer 54 is formed using at least one of TEOS silicon oxides, PECVD silicon oxides, silicon nitrides, silicon oxynitrides, silicon carbides, spin-on glass (SOG) such as silsesquioxanes and siloxane, xerogels or any other suitable material.

In another aspect of the present invention, the thickness of the inter-level dielectric layer 54 is in the range from about 3000 Å to about 8000 Å, and the thickness of the metal interconnect 52 is in the range from about 3000 Å to about 5000 Å. The inter-level dielectric layer 54 can be planarized by a chemical mechanical polish (CMP).

Figure 4:
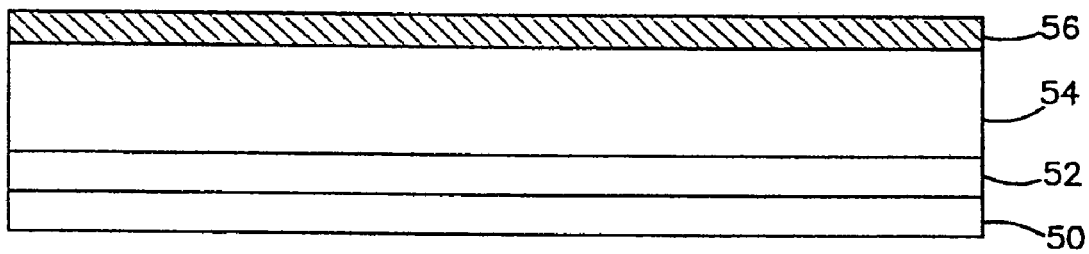
FIG. 4 illustrates a schematic cross-sectional view of the structure of FIG. 3 after deposition of a TFR material layer in accordance with an aspect of the present invention.

FIG. 4 illustrates the structure after a resistor material layer 56 is deposited over the inter-level dielectric layer 54. The resistor material layer 56 can be made from any suitable thin film resistor material including nickel chromium (NiCr), a nickel chromium (NiCr) alloy, silicon chromium (SiCr), a silicon chromium (SiCr) alloy, tantalum nitride (TaN), titanium nitride (TiN), or tungsten (W). The resistor material can be selected based on a desired resistance and stability including the temperature co-efficient of resistance (TCR) associated with the resistor material.

Any suitable technique for forming the resistor material layer 56 can be employed such as Low Pressure Chemical Vapor Deposition (LPCVD), Plasma Enhanced Chemical Vapor Deposition (PECVD), sputtering or high density plasma chemical vapor deposition (HDPCVD) techniques to a thickness suitable for forming a TFR. It is to be appreciated, however, that the present invention is applicable to other types of thin film formation, such as other deposition techniques (e.g., Physical Vapor Deposition (PVD), Metal Organic Chemical Vapor Deposition (MOCVD), Pulsed Laser Deposition (PLD)) and film growth techniques).

In one aspect of the present invention, the thickness of the TFR material layer 56 is in the range from about 30 Å to about 400 Å, and in another aspect of the present invention the thickness is in the range from about 100 Å to about 150 Å.

Figure 5:
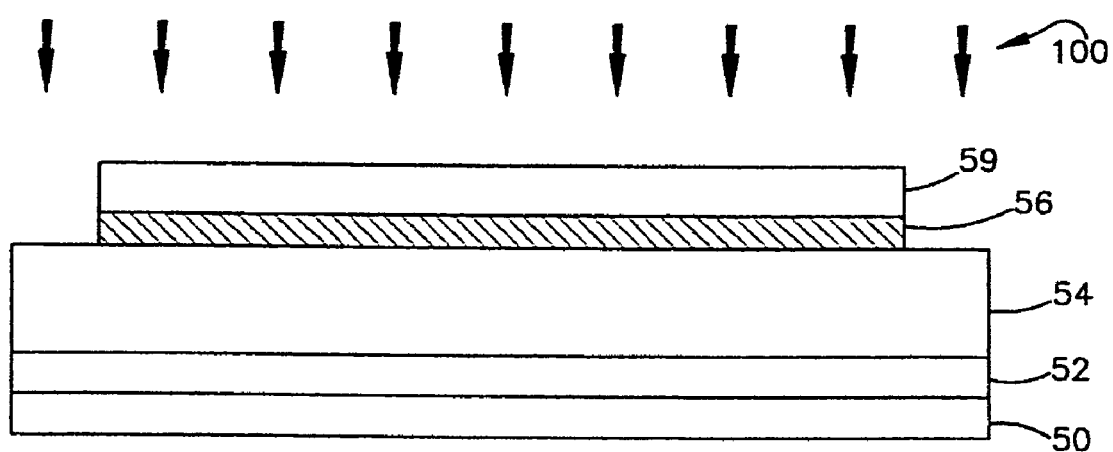
FIG. 5 illustrates a schematic cross-sectional view of the structure of FIG. 4 undergoing an etch step in accordance with an aspect of the present invention.

A patterned photoresist layer 59 is deposited over the TFR material layer 56. FIG. 5 illustrates the structure undergoing an etch 100 of the layer 56. The patterned photoresist layer 59 is used to define openings in the TFR material layer 56 during the etch 100. The photoresist layer 59 can have a thickness of about 10,000 Å to about 20,000 Å. However, it is to be appreciated that the thickness thereof may be of any dimension suitable for carrying out the present invention.

In one aspect of the invention, the etching process 100 uses either wet or dry chemistries or a combination of both. The photoresist layer 59 is stripped off of the TFR material 56 after the etch step is substantially complete.

Figure 6:
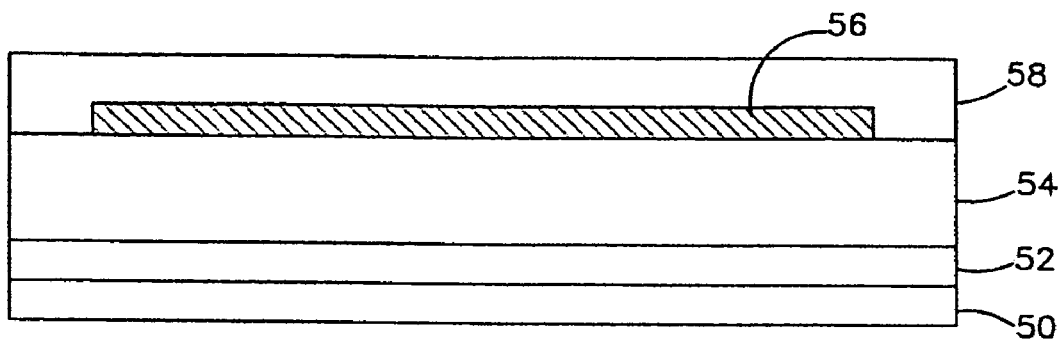
FIG. 6 illustrates a schematic cross-sectional view of the structure of FIG. 5 after deposition of a dielectric layer in accordance with an aspect of the present invention.
Figure 7:
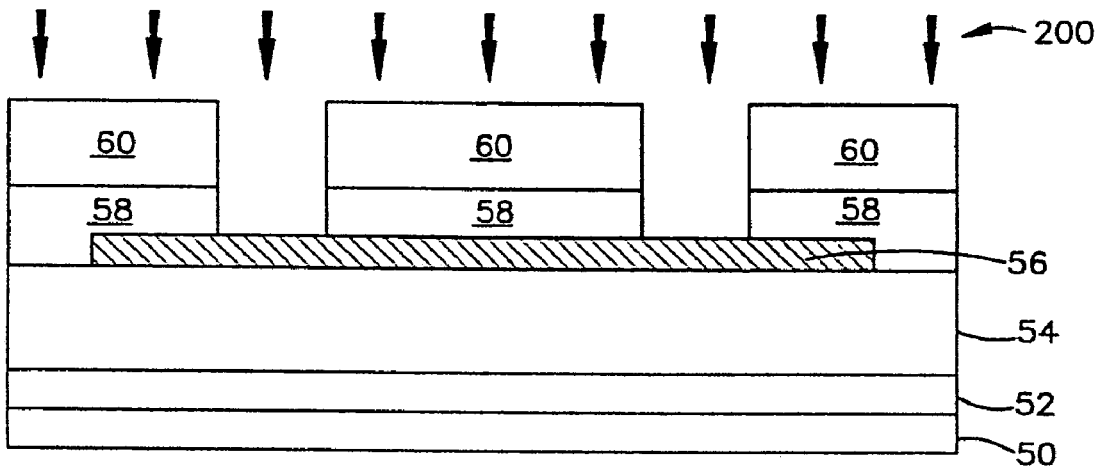
FIG. 7 illustrates a schematic cross-sectional view of the structure of FIG. 6 undergoing an etch step in accordance with an aspect of the present invention.
Figure 8:
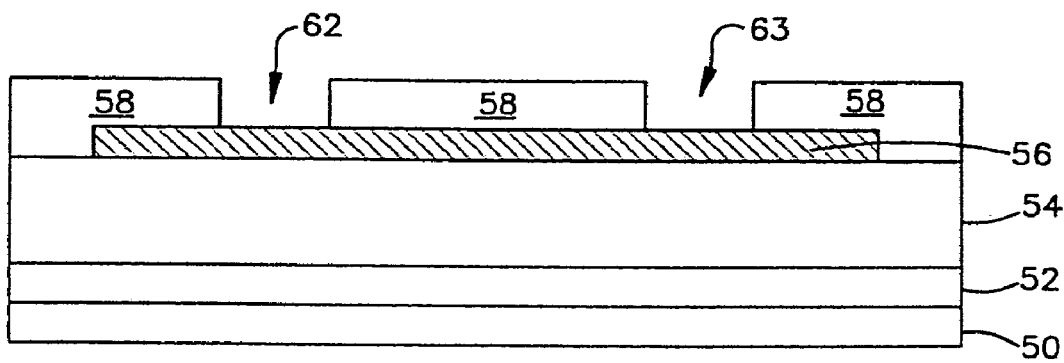
FIG. 8 illustrates a schematic cross-sectional view of the structure of FIG. 7 after the etch step is substantially complete in accordance with an aspect of the present invention.
Figure 9:
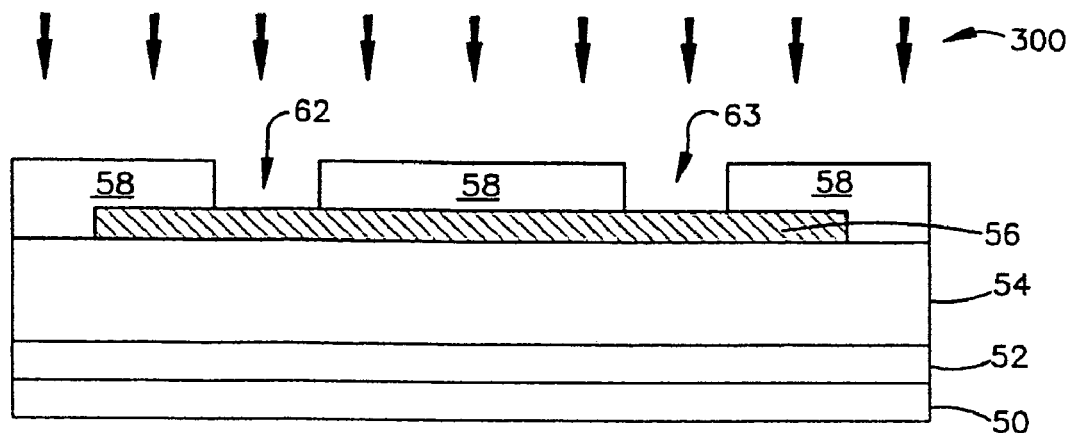
FIG. 9 illustrates a schematic cross-sectional view of the structure of FIG. 8 undergoing an additional etch step in accordance with an aspect of the present invention.

FIG. 6 illustrates the deposition of a dielectric layer 58 from which two TFR vias are formed. In FIG. 7, a patterned photoresist layer 60 is applied out of the surface of the dielectric layer 58. An etch step 200 is applied to form the two TFR vias in the dielectric layer 58. The TFR vias are etched using either wet or dry chemistries or a combination of both. The photoresist layer 60 is stripped to reveal the generated TFR vias 62, 63 (FIG. 8). After the photoresist layer 60 is stripped, an additional dilute hydrofluoric acid (HF) wet etch 300 is performed (FIG. 9) to remove a small layer of oxide, approximately 100 Å, thick above the TFR material layer 56.

Figure 10:
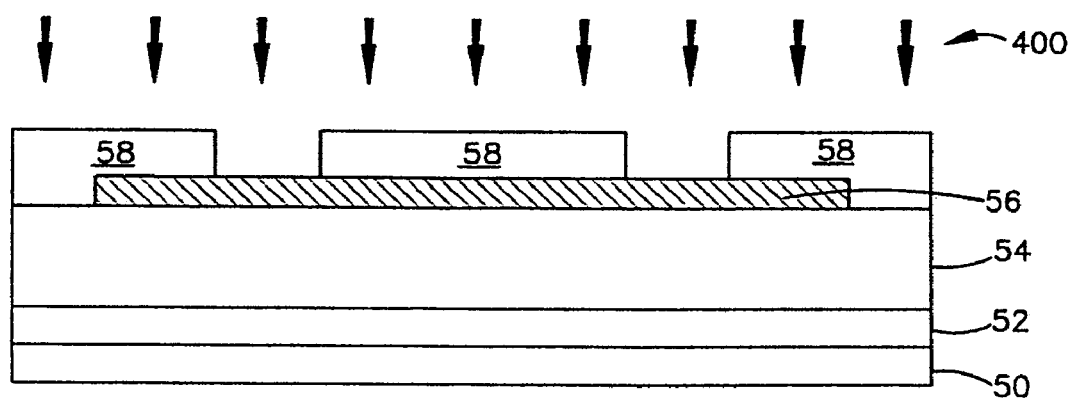
FIG. 10 illustrates a schematic cross-sectional view of the structure of FIG. 9 undergoing an additional etch step in accordance with an aspect of the present invention.
Figure 11:
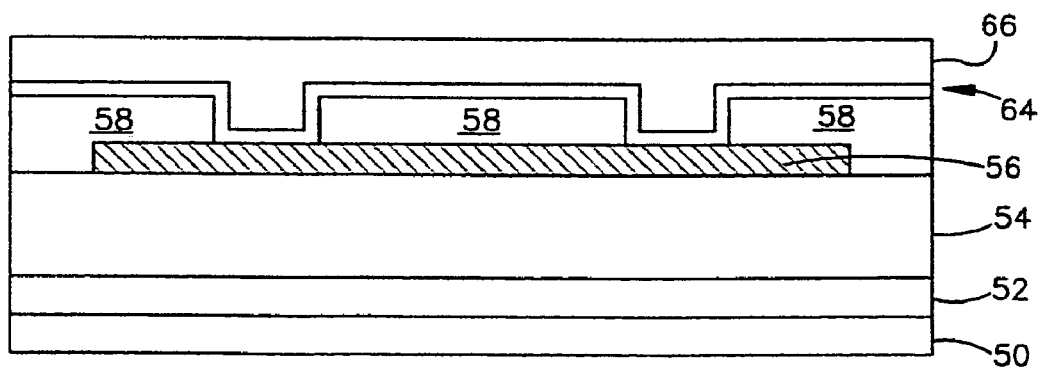
FIG. 11 illustrates a schematic cross-sectional view of the structure of FIG. 10 after deposition of an interface layer in accordance with an aspect of the present invention.

FIG. 10 illustrates a sputter etch process 400 applied in a vacuum environment to the entire surface of the structure without the presence of a photoresist layer. The sputter etch process 400 advantageously removes native oxides that build up on the TFR material layer 56, when it is exposed to atmosphere during previous processing. The first TFR vias 62, 63 form contact pads on the TFR material layer 56.

After the sputter etch process 400 is complete, a titanium (Ti) layer 64 is deposited (FIG. 11) into the first TFR vias 62, 63 over the TFR material layer 56 as well as over the remaining portions of the dielectric layer 58. A layer of titanium nitride (TiN) 66 is deposited over the Ti layer 66. The Ti layer 64 and the TiN layer 66 together comprise the interface layer 64 (e.g., TF Head or barrier/diffusion layer). Both the Ti layer 64 and the TiN layer 66 can be deposited using physical vapor deposition (PVD). The thickness of the Ti layer 64 can be in a range of about 100 to about 300 Å (e.g., 200 Å). The thickness of the TiN layer 66 can be in a range of about 800 to about 3000 Å (e.g., 2400 Å).

The effect of the sputter etch process 400 is to lower the interface layer resistance and to provide a more reproducible value of the interface layer resistance. Thus, resistance of the interface layer is lowered by applying the sputter etch process 400 to remove the native oxides on the TFR material layer 56 before applying the Ti layer 64 component of the interface layer, and as well by using specifically Ti:TiN as the interface layer.

Figure 12:
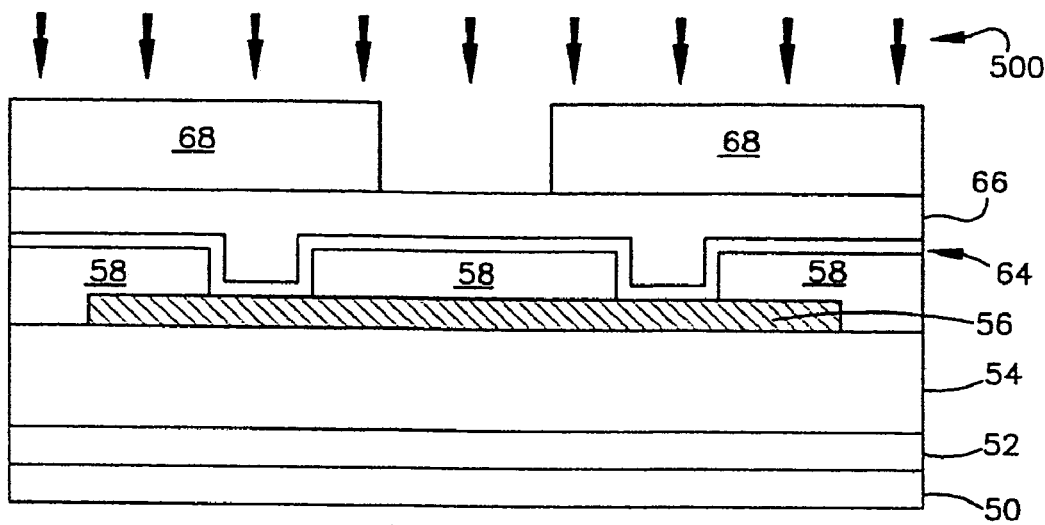
FIG. 12 illustrates a schematic cross-sectional view of the structure of FIG. 11 undergoing an etch step in accordance with an aspect of the present invention.
Figure 13:
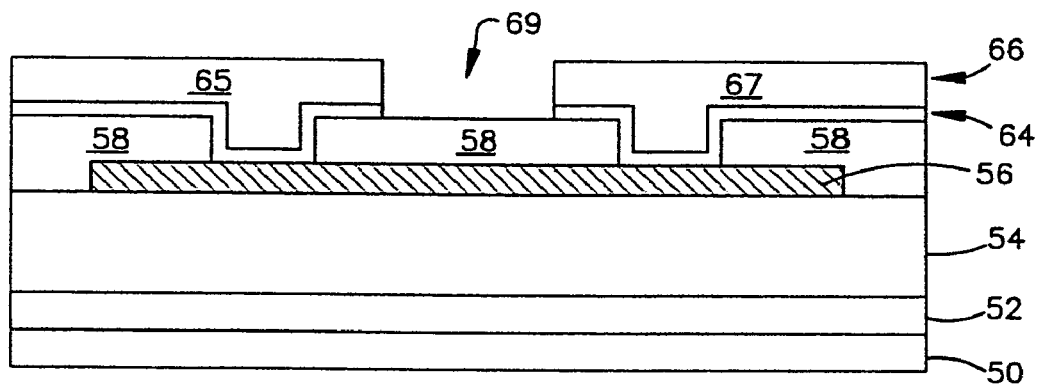
FIG. 13 illustrates a schematic cross-sectional view of the structure of FIG. 12 after the etch step is substantially complete in accordance with an aspect of the present invention.
Figure 14:
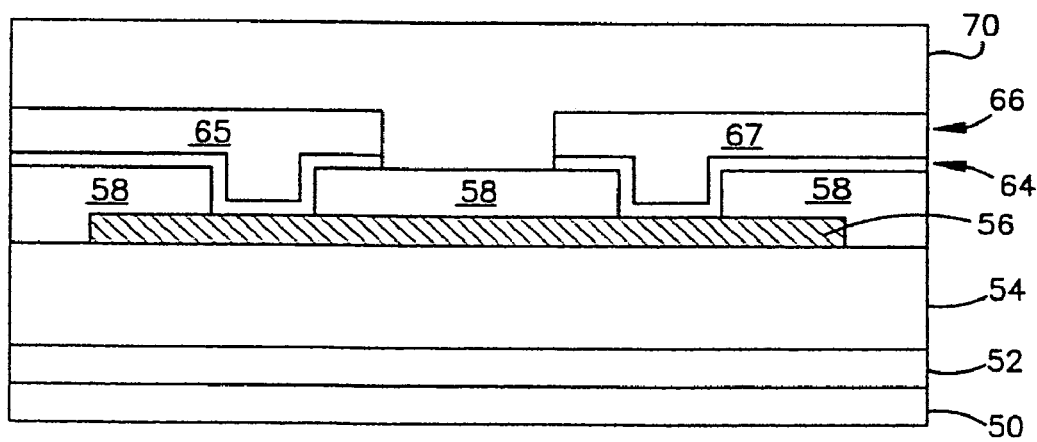
FIG. 14 illustrates a schematic cross-sectional view of the structure of FIG. 13 after deposition of a dielectric layer in accordance with an aspect of the present invention.
Figure 15:
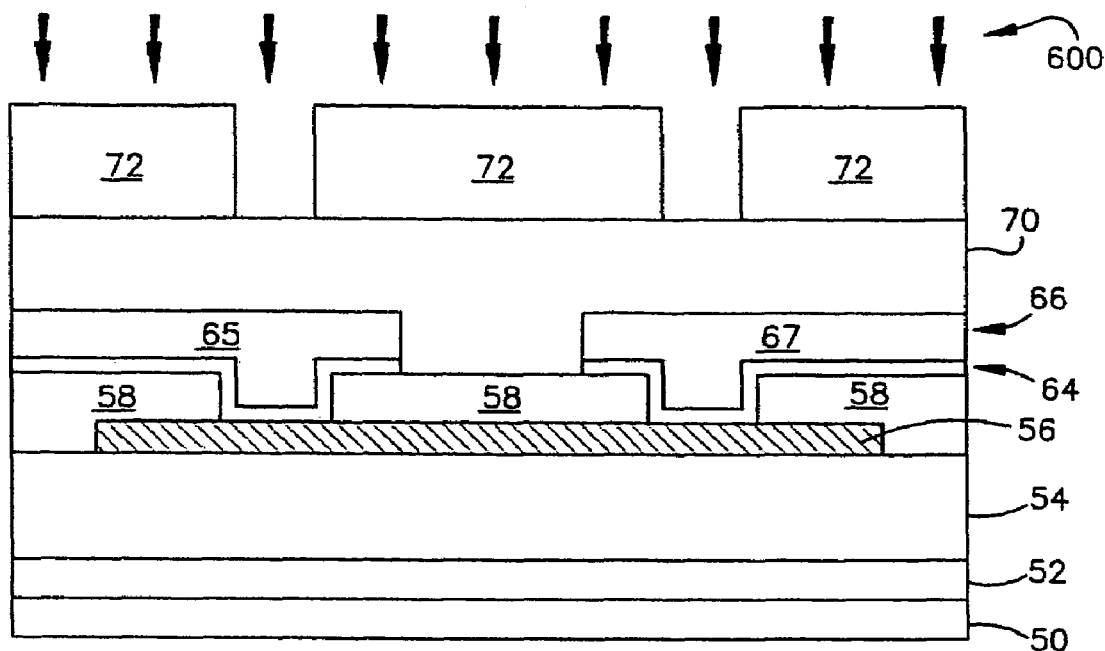
FIG. 15 illustrates a schematic cross-sectional view of the structure of FIG. 14 undergoing an etch step in accordance with an aspect of the present invention.

FIG. 12 illustrates the structure undergoing an etch 500 of the Ti:TiN layers 64 and 66. A patterned photoresist layer 68 is employed to form an opening 69 (FIG. 13) during the etch 500 that extends through the Ti:TiN layers 64 and 66 to expose a portion of the oxide layer 58, and to separate and electrically isolate the Ti:TiN layers 64 and 66 into a first electrical interface portion 65 and a second electrical interface portion 67. The resultant structure is illustrated in FIG. 13 after the remaining patterned photoresist 68 is stripped. The interface layers 64 and 66 can be etched with Chlorine or Fluorine chemistry using magnetic enhanced reactive ion etching (MERIE), electron cyclotron etching (ECR), or conventional reactive ion etching (RIE) methods. The chemistry should be highly selective to the Ti:TiN layers 64 and 66 over the underlying oxide layer 58 and the overlying patterned photoresist 68.

Figure 16:
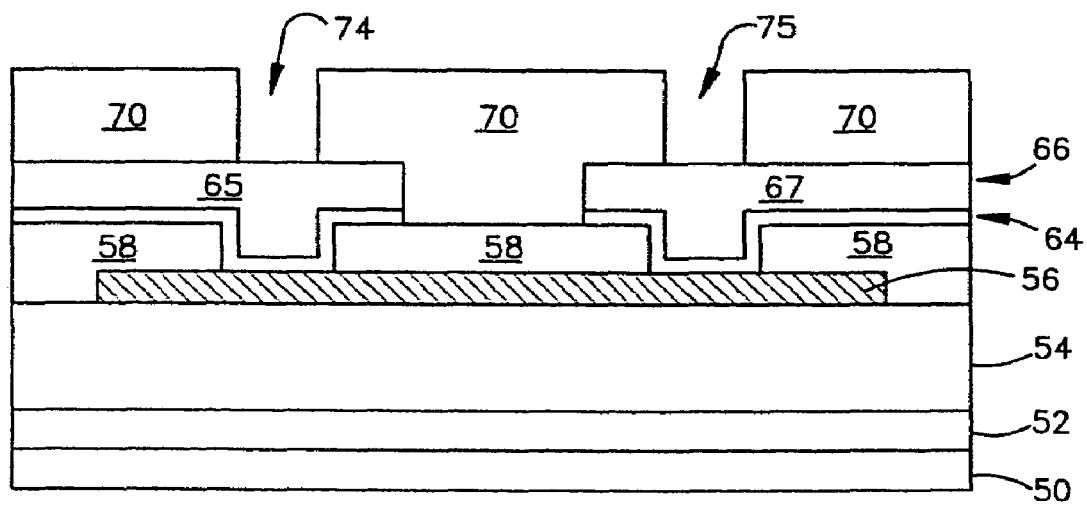
FIG. 16 illustrates a schematic cross-sectional view of the structure of FIG. 15 after the etch step is substantially complete in accordance with an aspect of the present invention.

An interlevel dielectric layer 70 is deposited (FIG. 14) over the remaining Ti:TiN interface layers 64 and 66 as well as in the opening 69 over the oxide layer 58. A patterned photoresist layer 72 (FIG. 15) is formed on the inter level dielectric layer 70. The patterned photoresist layer 72 is employed to define second TFR vias 74 and 75 (FIG. 12) during an etch 600 that extends through the inter level dielectric layer 70 to expose a portion of the interface layers 64 and 66. The second TFR vias 74 and 75 provide contact openings to the first electrical interface portion 65 and the second electrical interface portion 67. The etch 600 is any suitable wet or dry etching process. The resultant structure is illustrated in FIG. 16 after the remaining patterned photoresist 72 is stripped.

Figure 17:
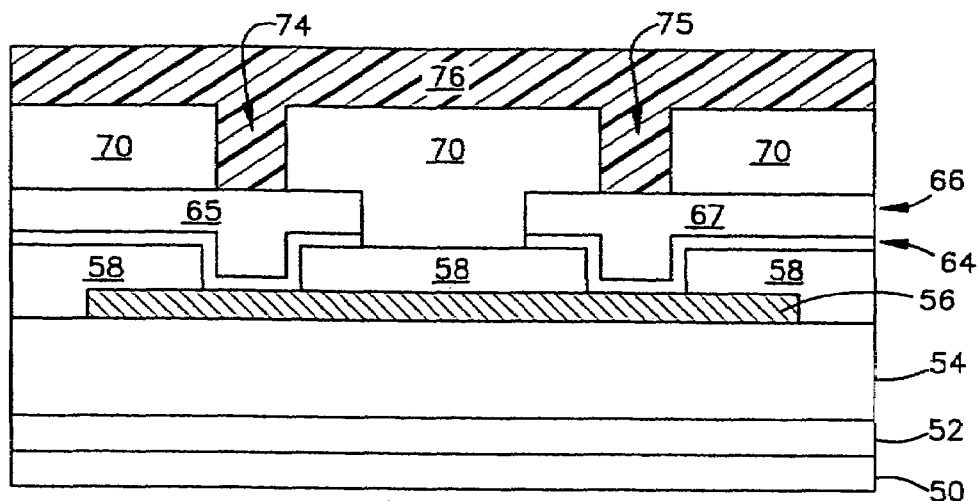
FIG. 17 illustrates a schematic cross-sectional view of the structure of FIG. 16 after deposition of a contact material layer in accordance with an aspect of the present invention.
Figure 18:
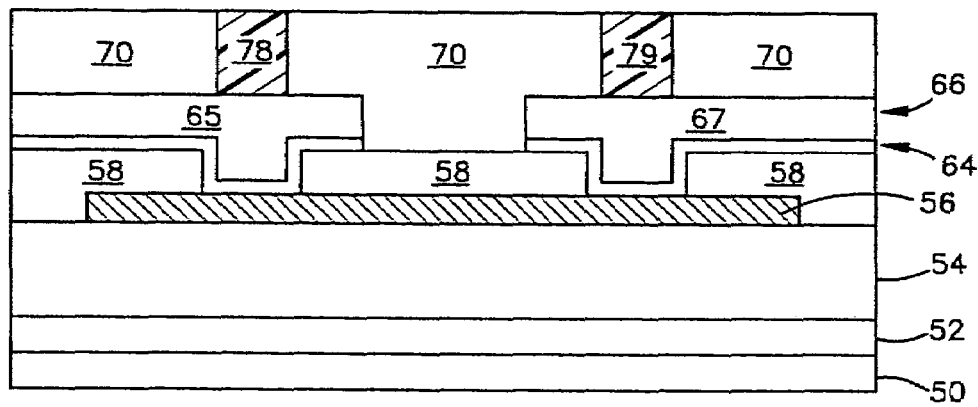
FIG. 18 illustrates a schematic cross-sectional view of the structure of FIG. 17 after undergoing a chemical mechanical polish in accordance with an aspect of the present invention.

FIG. 17 illustrates a contact material layer 76 deposition over the remaining dielectric layer 70, and in the second TFR vias 74, 75 over the exposed first and second electrical interface portions 65 and 67. The contact material layer 76 is deposited employing conventional metal deposition techniques. The contact material layer 76 can be formed from one of tungsten, aluminum, aluminum alloy, copper, copper alloy, or a tungsten alloy. The contact material layer 76 is planarized by a chemical mechanical polish (CMP) to remove the contact material over the dielectric layer 70, and to leave the contact material deposited in the second TFR vias 74, 75 to form a first contact portion 78 and a second contact portion 79 connected to the first and second electrical interface portions. The resultant structure is illustrated in FIG. 18.

Figure 19:
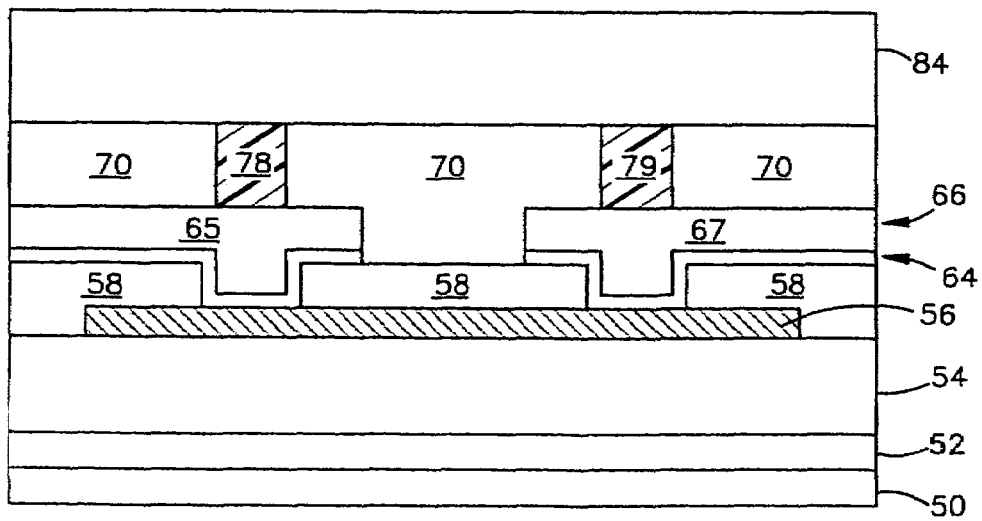
FIG. 19 illustrates a schematic cross-sectional view of the structure of FIG. 18 after deposition of a metal interconnect layer in accordance with an aspect of the present invention.

FIG. 19 illustrates deposition of a metal interconnect 84 over the remaining dielectric layer 70 and in the second TFR vias 78, 79 the metal interconnect layer 84 is deposited employing conventional metal deposition techniques. The metal interconnect layer 84 can be aluminum, aluminum alloy, copper, copper alloy, tungsten or a tungsten alloy or a composite of predominantly aluminum with small amounts of titanium and titanium nitride.

Figure 20:
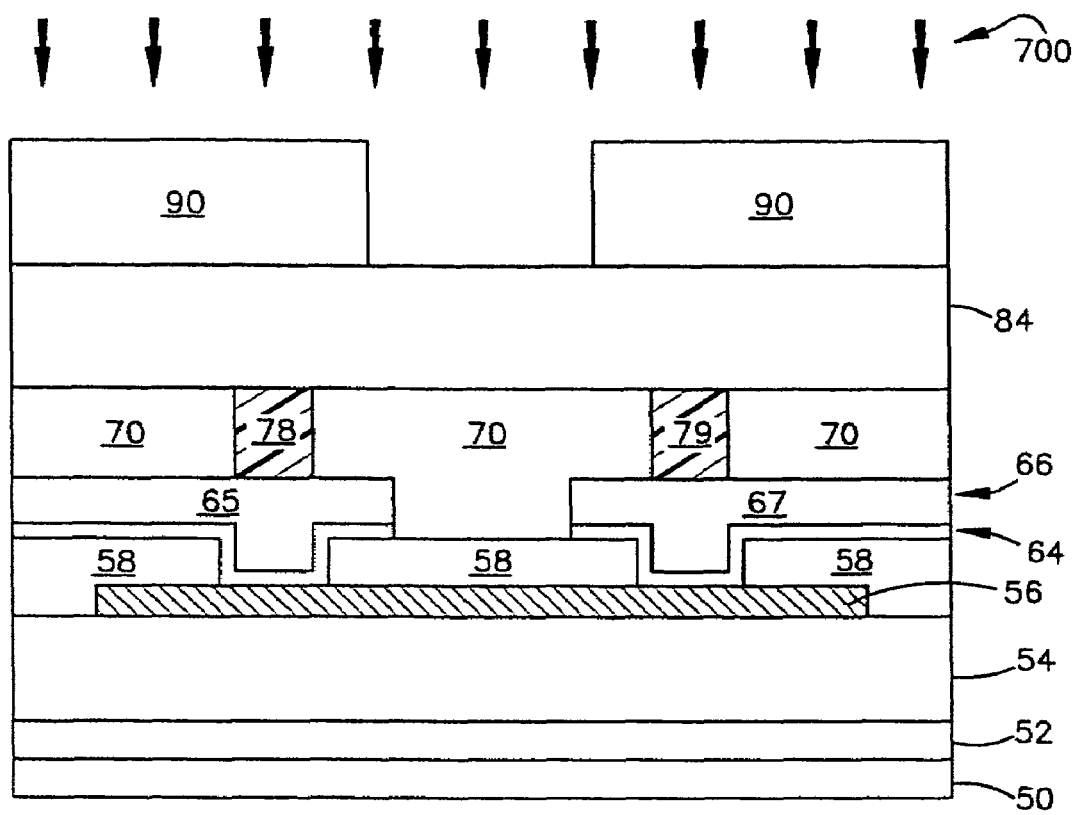
FIG. 20 illustrates a schematic cross-sectional view of the structure of FIG. 19 undergoing an etch step in accordance with an aspect of the present invention.

FIG. 20 illustrates the photoresist layer 90 patterned over the metal interconnect layer 84 to form the interconnect. A timed etch 700 can be employed with chemistry to etch away the conductive material or metallization layer 84, until reaching the underlying dielectric layer 70. The timed etch 700 of the conductive material layer 84 is performed to form conductive portions 83 and 85 that provide electrical interconnections to the TFR, such the conductive portions 83 and 85 of the conductive material 84 form a continuation of the contact portions 78 and 79.

Figure 21:
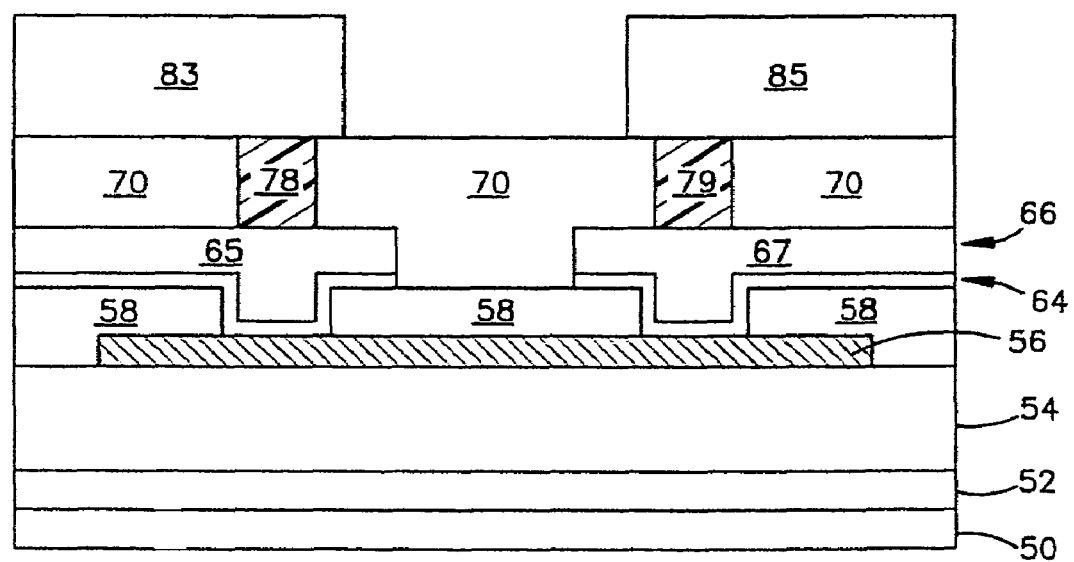
FIG. 21 illustrates a schematic cross-sectional view of the structure of the resultant structure after the etch step is substantially complete in accordance with an aspect of the present invention.

The resultant structure is illustrated in FIG. 21 after the timed etch 700 is performed. Following the timed etch 700, the TFR is exposed to an oven baking process (e.g., at 400° C.) to cause the TFR to stabilize into defined layers. Any number of intervening layers can then be formed over the resultant structure illustrated in FIG. 21.

What has been described above includes examples and implementations of the present invention. Because it is not possible to describe every conceivable combination of components, circuitry or methodologies for purposes of describing the present invention, one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A thin film resistor (TFR) structure comprising:
   a TFR;
   a first electrical interface portion directly coupled to a first end of the TFR; the first electrical interface portion comprising:
   a first layer of titanium (Ti) adjacent to the first end of the TFR, and
   a first layer of titanium nitride (TiN) formed on the first layer of Ti, wherein the first layers of Ti and TiN are located within a first opening formed in a first dielectric overlying the TFR; and
   a second electrical interface portion directly coupled to a second end of the TFR, the second electrical interface potion comprising:
   a second layer of Ti adjacent to the second end of the TFR, and
   a second layer of TiN formed on the second layer of Ti, wherein the second layers of Ti and TiN are located within a second opening formed in the first dielectric overlying the TFR;
   a second dielectric layer located on the first and second layers of TiN;
   a first contact extending through the second dielectric layer and contacting the first layer of TiN; and
   a second contact extending through the second dielectric layer and contacting the second layer of TiN.

2. The TFR structure of claim 1, the TFR formed from one of silicon chromium (SiCr) alloy, nickel chromium (NiCr) alloy, tantalum nitride, titanium nitride, and tungsten.

3. The TFR structure of claim 1, the Ti layer having a thickness in the range from about 100 Å to about 300 Å.

4. The TER structure of claim 1, the TiN layer having a thickness in the range from about 800 Å to about 3000 Å.

5. The TFR structure of claim 1, the thin film resistor having a thickness in the range of about 50 Å to about 400 Å.

6. The TFR structure of claim 1, each of the first contact and the second contact comprising a conductive portion and a contact portion extending from the respective electrical interface portion to the respective conductive portion.

7. The TFR structure of claim 6, the contact portions being formed from at least one of tungsten, aluminum, aluminum alloy, copper, copper alloy and a tungsten alloy, and the conductive portions being formed from at least one of aluminum, aluminum alloy, copper, copper alloy, tungsten, a tungsten alloy and a composite of aluminum with titanium and titanium nitride.

8. The TFR structure of claim 1, further comprising an oxide layer below portions of the first electrical interface portion and the second electrical interface portion with defined openings that provide electrical contact to the first and second ends of the TFR.

* * * * *